United States Patent [19]

Gupta et al.

[11] Patent Number: 4,908,570

[45] Date of Patent: Mar. 13, 1990

[54] METHOD OF MEASURING FET NOISE PARAMETERS

[75] Inventors: Madhu S. Gupta, Oakpark, Ill.; Paul T. Greiling, Thousand Oaks; Steven E. Rosenbaum, Canoga Park, Calif.; Octavius Pitzalis, Malibu, Calif.

[73] Assignee: Hughes Aircraft Company, Los Angeles, Calif.

[21] Appl. No.: 56,848

[22] Filed: Jun. 1, 1987

[51] Int. Cl.⁴ ..................... G01R 29/26; G01R 31/00
[52] U.S. Cl. .................. 324/158 T; 324/613; 324/636; 324/73.1
[58] Field of Search ............ 324/117 R, 158.1, 73 R, 324/58 R, 58 A, 58 B, 57 N; 381/68.2

[56] References Cited

U.S. PATENT DOCUMENTS

| | | | |
|---|---|---|---|
| 4,288,911 | 9/1981 | Ports | 324/158 T |
| 4,324,255 | 4/1982 | Barach et al. | 324/117 R |
| 4,626,775 | 12/1986 | Cho et al. | 324/73 R |
| 4,628,529 | 12/1986 | Borth et al. | 381/68.2 |
| 4,630,305 | 12/1986 | Borth et al. | 381/68.2 |

OTHER PUBLICATIONS

"Representation of Noise in Linear Two Ports", by Haus, IRE Proc., 1/1960, pp. 69-74.
Theory of Noisy Fourpoles, by Rothe et al., IRE Proc., 6/56, pp. 811-819.
"Noise Characteristics of Gallium Arsenide Field-Effect Transistors", by Statz, IEEE, Trans. on Elec. Dev., vol. 21, #9, 9/74, pp. 549-562.
"S—Parameter Techniques for Faster, More Accurate Network Design", by Anderson, Hewlett-Packard Journ., 2/67, vol. 18, #6, pp. 3/1-3/12.
"Measurement of GaAs FET Noise Prameters", by Froelich, Watkins-Johnson Comp. Tech.-Notes, vol. 13, #6, Nov./Dec. 1986, pp. 2-12.
"Scattering Parameters Speed Design of High-Frequency Transistor Circuits", by Weinert, Electronics, 9/5/66, pp. 2-1-2-11.
"Derive Noise and Gain Parameters in 10 Seconds", by Tome, Microwaves, 8/78, pp. 53, 55-57.
"A Functional GaAs FET Noise Model", by Podell, IEEE Trans. on Electron. Dev., vol. Ed-28, #5, pp. 511-517, 5/81.
"Two Port Power Flow Analysis Using Generalized Scattering, Parameters", by Bodway, Microwave Journal, vol. 10, #6, 5/67, pp. 6/7-6/9.

Primary Examiner—Reinhard J. Eisenzopf
Assistant Examiner—W. Burns
Attorney, Agent, or Firm—Wanda K. Denson-Low; Paul M. Coble

[57] ABSTRACT

A method is described for measuring the noise parameters of field effect transistors (FETs) while still in the wafer stage. Instead of conducting lengthy testing of each individual device at the operating frequency of interest after the devices have been diced, mounted and bonded, each of the devices on a wafer is automatically probed to obtain the standard S-parameters and also the FET's output noise power $P_n$ at a frequency at which parasitic probe effects are avoided. The various noise parameters can then be calculated for higher operating frequencies of interest from FET equivalent circuit parameters derived from the S-parameters, and from $P_n$, either before or after dicing.

27 Claims, 4 Drawing Sheets

METHOD OF MEASURING FET NOISE PARAMETERS

BACKGROUND OF THE INVENTION

1. Field of the Invention

This invention relates to the measurement of noise in field effect transistors (FETs), and more particularly to the measurement of noise for FETs operated toward the upper end of the microwave frequency range.

2. Description of the Related Art

With the exception of masers, the FET family of transistors are the lowest noise active devices presently known. Masers are expensive, cumbersome, narrow band, bulky because of the necessary cryogenic equipment, and in general so difficult to work with that they are not presently sold commercially. FETs on the other hand have the advantages of wide bandwidth, stable operation, ease of monolithic integration in integrated circuits, high efficiency and versatility of applications. Their low noise property is particularly important in satellite communication applications, and can also be useful in other applications such as radar, microwave links, and optical or infrared receivers. In each of these applications the ability to measure the noise parameters of the FET in its circuit can be used for device screening and selection of circuits that meet the particular specifications of the device, or for diagnostic purposes.

The generally known prior methods of making noise measurements in FETs are reviewed in National Bureau of Standards Monograph No. 142, U.S. Department of Commerce, 1974. A volume on the state-of-the-art for determining noise in FETs which includes reprints of significant publications on the subject is H. Fukui, "Low-Noise Microwave Transistors and Amplifiers", *IEEE Press*, New York 1981.

Integrated circuit FETs employed in amplifier circuits and the like are formed on thin semiconductor wafers, with the FET circuit replicated on the wafer thousands of times. With the conventional technique for measuring FET noise, the wafer is first diced into small separate chips of one FET each, and each individual FET is then mounted and wire bond connected in a circuit. Unlike testing at the wafer stage prior to dicing when all devices on the wafer can be tested with only one wafer handling operation, the separate devices must be individually handled in the noise testing procedure because they have already been mounted and bonded. Since the yield of high-performance devices is low (particularly for mm wave devices, which have such small dimensions that their characteristics change significantly with the etching of even a couple of atomic layers during fabrication), the individual mounting, bonding and testing steps carried out on rejected devices are wasted.

The conventional test procedure itself is a very lengthy and time-consuming process. For example, one important noise parameter is $F_{min}$, which represents the minimum noise figure for the FET (under the circumstances when it is connected in an optimum circuit). In one testing procedure the device is mounted in a microwave circuit which is operated at the operating frequency of interest, and $F_{min}$ is measured either by making four or more measurements of the noise figure, and the corresponding source impedances at the FET input, or by a trial and error approach which involved manually tuning the circuit while observing a noise meter, and taking the minimum noise reading as $F_{min}$. A complicating problem is that there are many different ways to tune the circuit, all of which must be done slowly and carefully. The process is so laborious and time-consuming that it is suitable only for laboratory applications. Other attempts to avoid these shortcomings have involved even more elaborate measurement setups. See K. Froelich, "Measurement of GaAs FET Noise Parameters", *Watkins Johnson Co. Tech. Notes*, Vol. 13, No. 6, pages 2-11, Nov./Dec. 1986; R. Q. Lane, "Derive Noise and Gain Parameters in 10 Seconds", *Microwaves*, Vol. 17, No. 8, pages 53-57, August 1978.

In the other method of measurement, $F_{min}$ is derived from a measured value of the noise figure F and the admittance $Y_g$ of the generator or signal source presented to the FET during measurement at the operating frequency. The minimum noise figure $F_{min}$ can be deduced from the data only if four or more values of F are measured for four well-separated values of $Y_g$. In addition to the difficulty of tuning $Y_g$ in a probe station set-up, a measurement of $Y_g$ must also be carried out at the low measurement frequency.

An ability to test for FET noise while still at the wafer stage would be very desirable, and could result in substantial savings. However, there are a number of obstacles which have not been overcome. With current testing equipment capable of handling entire wafers, the probes used for accessing individual devices contribute parasitic impedances to the measurement. These can be made tolerable at UHF and low microwave frequencies (the microwave range is generally taken to be about 1-100 GHz). However, at the upper end of the microwave frequency range (above about 20 GHz), the probes have a significant or even dominant effect upon the value of the measured noise figure (F).

Another problem with any attempt to test at wafer stage with present techniques is that, if the noise figure F is measured at a sufficiently low frequency at which the probe station parasitic effects are small, after $F_{min}$ and the other noise parameters have been deduced at the low frequency a method must be devised for predicting them from the $F_{min}$ of the device at them much higher operating frequency. Furthermore, experimental measurements of the noise figure of mm wave MESFET devices as a function of frequency have shown that at low frequency (typically below a few GHz for 0.25 micron gate-length devices), the measured noise figure is strongly influenced by the circuit losses. As a result, the measured $F_{min}$ at the low frequency is not a direct measure of the device capability at the higher operating frequency, and cannot be used to predict the high frequency device performance. Attempts to reduce circuit losses at the low frequency are again stymied by the wafer handling probe station.

SUMMARY OF THE INVENTION

The present invention provides a novel method of measuring FET noise parameters which completely avoids the above problems, and which allows taking the measurements while the FET is still at the wafer stage. The device is physically probed at a relatively low frequency that avoids the parasitic problem, and yet yields information that can be readily translated to obtain the noise parameters that would apply at much higher frequencies. Since the measurements are performed at the wafer stage of transistor fabrication, prior to the dicing, mounting and bonding of individual devices, a great savings is achieved. No circuit tuning of individual devices is required to identify the minimum noise figure $F_{min}$, and measurements are simpler, faster and less subject to the uncertainty as to whether a minimum value of the noise figure has indeed been reached. The improvement is of such a magnitude that measurement is possible on production batches of transistors, using automated test equipment.

The measurements made with the invention provide more diagnostic information about the cause of any unusually low or high noise parameter than would be provided by the direct measurement of the noise figure, since it makes known each of several different principal contributing factors to the noise parameters. When the yield of high performance devices is low, rejects can be identified while still on the wafer, thereby avoiding the need to dice, mount and bond such devices. A large number of FETs can be tested by a single wafer-handling operation, rather than the prior individual handling required for each separate device. Also, the prior requirement for the tuning of a tunable circuit fixture is eliminated, with an accompanying economy.

The invention operates by bypassing the direct measurement of the noise parameters, and instead preferably derives the noise parameters from lower frequency measurements of the FET scattering parameters (S-parameters) and the device's output noise power ($P_n$). Each of these measurements, typically below 1 GHz, can be obtained easily at the wafer stage. The S-parameters are employed to derive the values of the equivalent circuit parameters of the intrinsic FET used in a noise characterization, which have been found to be the input gate-to-source capacitance ($C_{gs}$), input resistance ($R_T$), transconductance ($g_m$) and output resistance ($R_o$); where $R_o$ is much greater than the input impedance of a preamplifier or receiver used in the measurement of $P_n$, the determination of $R_o$ can be omitted.

In performing the calculations to determine the noise parameters from the S-parameters and $P_n$, the FET's intrinsic output noise current spectra density ($S_{io}$) in introduced. This quantity, unlike the measured output noise power $P_n$, is independent of the characteristics of the receiver used to measure $P_n$, such as the gain, bandwidth and input resistance of the receiver, thereby making the calculation free of these extraneous factors.

Expressions are obtained which relate each of the noise parameters to at least some of the equivalent circuit FET parameters and $P_n$. $P_n$ can be measured at a relatively low frequency, such as 1 GHz, thereby avoiding the parasitic problems associated with higher frequencies. However, once the basic S-parameter and $P_n$ measurements have been made, the expressions provide accurate noise parameter calculations for any desired frequency within a much higher frequency range, exceeding 20 GHz.

Further features and advantages of the invention will be apparent to those skilled in the art from the following detailed description of preferred embodiments, taken together with the accompanying drawings, in which:

DETAILED DESCRIPTION OF PREFERRED EMBODIMENTS

Several sets of four noise parameters can be used to describe the noise in a linear twoport device. For example, if the twoport device is represented by two noise sources added to its noiseless version, as in the models presented by H. Rothe and W. Dahlke, "Theory of Noisy Fourpoles", *Proc. IRE*, Vol. 44, No. 6, pages 811–818, June 1956, the noise parameters may be the power spectral densities of the two noise sources, and their complex cross-spectral density. In circuit applications, the four noise parameters are usually taken to be the minimum noise figure $F_{min}$ of the twoport, the optimum value of a generator or signal source admittance which when applied to the device will produce $F_{min}$, add a coefficient $R_n$ having the units of resistance. The generator or signal source admittance is expressed as $Y_g = G_g + jB_g$, while $R_n$ measures how rapidly the noise figure degrades when the generator admittance $Y_g$ deviates away from its optimum value. As discussed in the report by IRE Subcommittee 7.9 on Noise (H. A. Haus, Chairman), "Representation of Noise in Linear Two-Ports", *Proc. IRE*, Vol. 48, No. 1, pages 69–74, January 1960, the noise figure for any generator admittance can be expressed in terms of these four parameters as follows:

$$F(Y_g) = F_{min} + \frac{R_n}{G_g}[(G_g - G_{g,op})^2 + (B_g - B_{g,op})^2]. \quad (1)$$

where the subscript op indicates the optimum value at which $F_{min}$ occurs.

Figure 1:
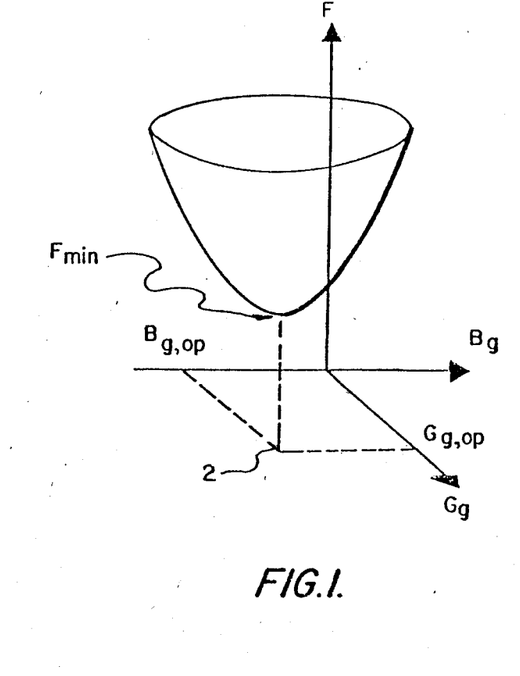
FIG. 1 is a three-dimensional graph relating the noise parameters F, $G_g$ and $B_g$.

The relationship between F and the components of $Y_g$ is illustrated in FIG. 1. $F_{min}$ occurs at the intersection 2 of the optimum values for $G_g$ and $B_g$. The noise figure F progressively increases away from $F_{min}$ as $G_g$ and $B_g$ diverge from their optimum values.

Figure 2:
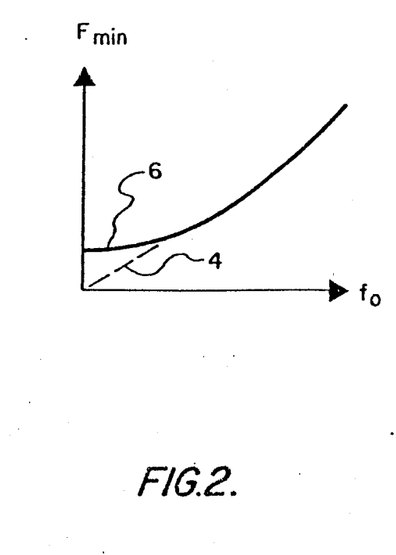
FIG. 2 is a graph relating $F_{min}$ to operating frequency.

The operating frequency $f_0$ at which the device is operated also influences $F_{min}$, as illustrated in FIG. 2. The dashed curve 4 shows how $F_{min}$ monotonically decreases towards unity ($=0$ dB) as $f_0$ decreases. This is due to the decrease of input conductance of the device with decreasing frequency. This effect was predicted theoretically in H. Statz, H. A. Haus and R. A. Pucel, "Noise Characteristics of Gallium Arsenide Field-Effect Transistors", *IEEE Trans. Electron Devices*, Vol. ED-21, No. 9, pages 549–562, September 1974, and is implicit in various empirical formulas for $F_{min}$. Experimental measurements, on the other hand, yield $F_{min}$ of the amplifier circuit in which the device is located rather than $F_{min}$ of the intrinsic device alone, and its observed variation with frequency is shown by the soil line 6. At low frequencies, where the circuit losses dominate at the input port, the circuit $F_{min}$ approaches a constant value greater than 0 dB, which depends on the circuit losses.

In accordance with the invention, the noise parameters of an FET are obtained by a simple measurement of the device's S-parameters while still in the wafer state. This requires much less handling than does noise testing after the individual devices have been separated, and eliminates the wasted effort in dicing, mounting and bonding individual devices which are later rejected. Together with a measurement of the device's output noise power $P_n$, which is easily measured, the device's S-parameters may be used to deduce the various noise parameters with much greater ease than in the past. $P_n$, which may also be referred to as the device's internal or spontaneous noise, is the noise which is internally generated within the FET due to mechanisms inherent in the device, and is measured by a sensitive narrow-band receiver.

The S-parameters are well described in the literature. For example, see Richard W. Anderson, "S-Parameter Techniques for Faster, More Accurate Network Design", *Hewlett-Packard Journal.* Vol. 18, No. 6, February 1967; F. Weinert, "Scattering Parameters Speed Design of High Frequency Transistor Circuits", *Electronics,* Vol. 39, No. 18, Sept. 5, 1986; and G. E. Bodway, "Twoport Power Flow Analysis Using Generalized Scattering Parameters", *Microwave Journal,* Vol. 10, No. 6, May 1967. The S-parameters are used in a conventional manner to deduce the values of the particular FET parameters present in the equivalent circuit of the FET which are employed by the invention to determine the noise parameters. These are the input gate-to-source capacitance $C_{gs}$, the total input resistance $R_T$ of the device in series with $C_{gs}$, the output resistance $R_o$, and the device transconductance $g_m$. A computer program is preferably used to determine the values of the FET parameters for a least-mean-square-error fit to the measured S-parameters.

Figures 3, 6:
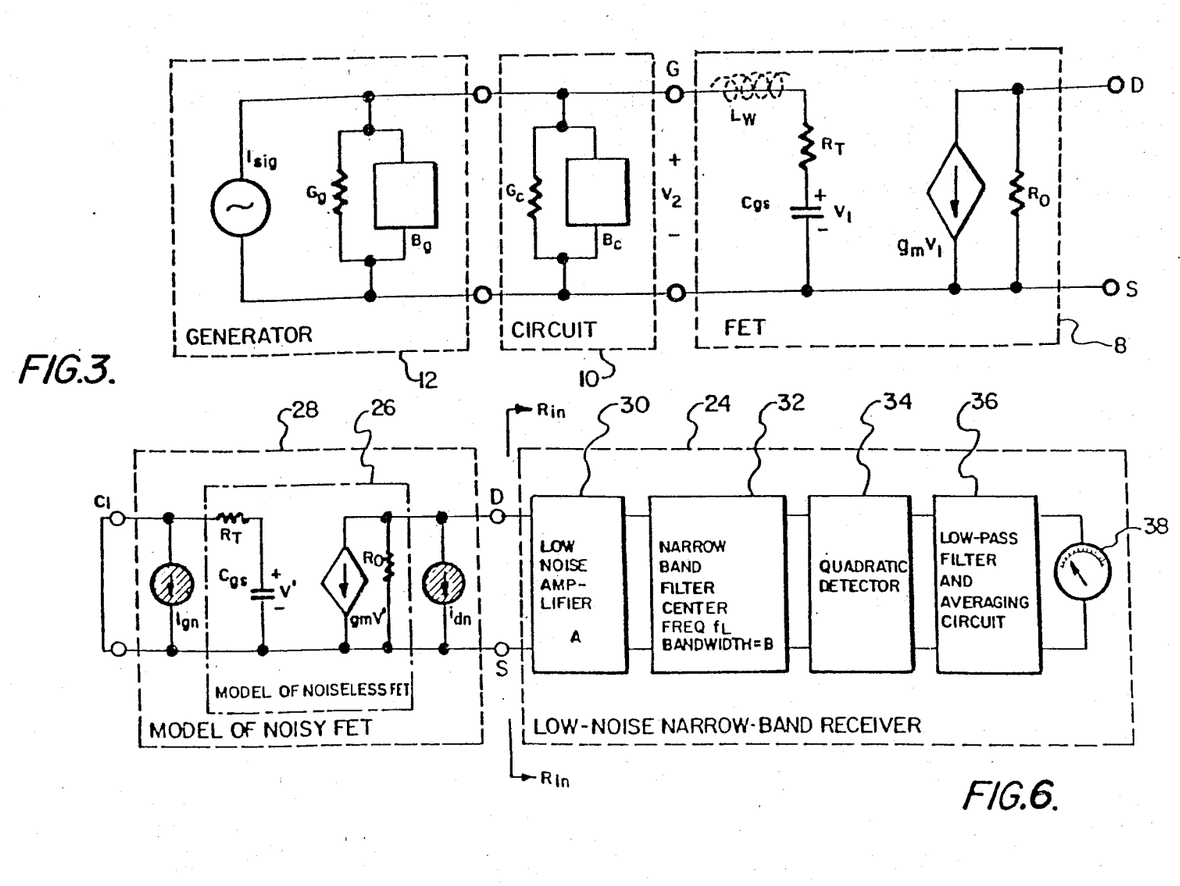
FIG. 3 is an equivalent circuit of the FET, the input side of the circuit in which the FET is imbedded, and a signal source connected to the FET circuit.
FIG. 6 is a combined equivalent circuit and block diagram showing the set-up for measuring the noise power output ($P_n$) of an FET.

An equivalent circuit is provided in FIG. 3 of an FET 8 which is connected within an amplifier circuit 10 to which a signal is applied from a generator or signal source 12. The FET 8 is shown in a common source configuration, with the input applied between the gate and source terminals and the output taken from the drain and source terminals. At the input $R_T$ is connected in series with $C_{gs}$, across which a gate-source voltage $V_1$ is developed. The bonding wire inductance $L_w$ which would be present in actual devices is indicated in dashed lines in series with $R_T$, and can be assumed to be 0 for purposes of this discussion. The FET output circuit consists of the parallel connection of $R_0$ and a current source having a value $g_m V_1$.

The amplifier circuit 10 of which the FET 8 is a part is illustrated as having a conductance $G_c$ in parallel with a susceptance $B_c$, while the generator 12 similarly has a conductance $G_g$ and susceptance $B_g$. The optimum values of $G_g$ and $B_g$ are two of the four noise parameters which are obtained with the invention.

Figure 4:
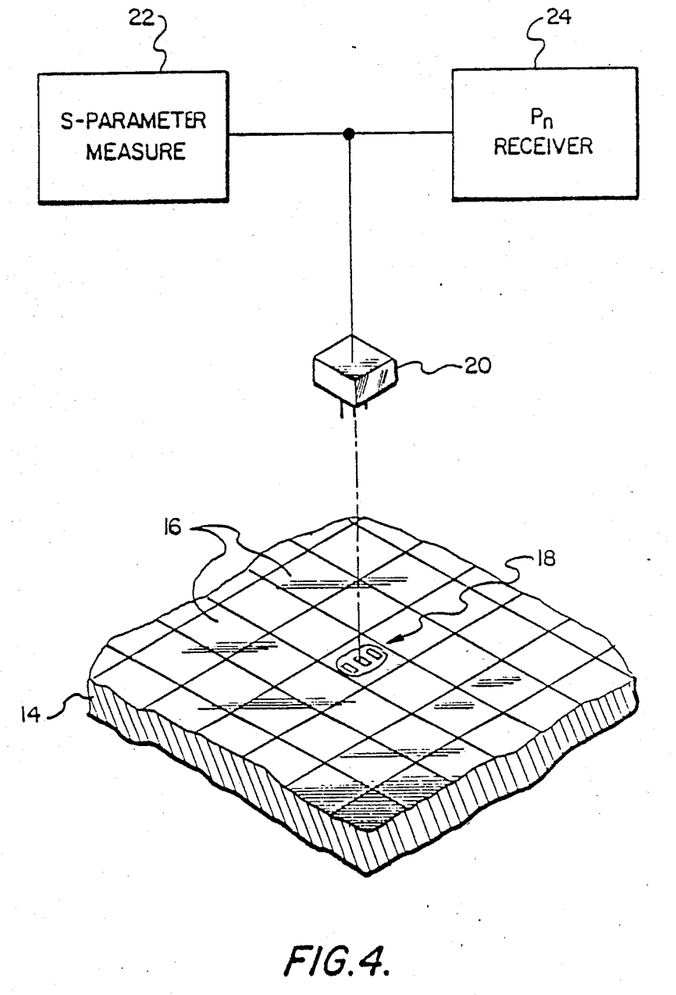
FIG. 4 is a block diagram, illustrating the wafer probe technique employed by the invention.

The present invention is particularly useful for metal-semiconductor FETs (MESFETs) and for high electron mobility transistors (HEMTs), but in general is applicable to the entire family of FETs. A simplified diagram of the measurement technique employed to obtain the noise parameters meters of FETs while still at the wafer stage is illustrated in FIG. 4. A semiconductor wafer 14, such as gallium arsenide or silicon, has formed thereon a large number of replicated circuits 16, which can number in the thousands for each wafer. Each circuit is assumed to include an FET, which is illustrated in the center circuit by a set of source, gate and drain surface bonding pads 18. A conventional probe 20 has very fine pins which are aligned with the three bonding pads. The probe is connected to both an S-parameter measurement mechanism 22, and to a $P_n$ receiver 24. S-parameter measurement devices are generally known, and various types of noise power receivers such as spectrometers could be used for $P_n$ receiver 24. A communication receiver or a spectrum analyzer, preceded by a preamplifier of sufficiently low noise and high gain, would be suitable.

In operation, wafer 14 is mounted on a moveable stage below probe 20. The probe is lowered so that its pins contact the FET bonding pads, and the S-parameter and $P_n$ measurements are taken. The probe is then raised and the wafer stage incremented so that another FET is aligned below the probe. The probe is then lowered to contact the second FET, and the process proceeds very rapidly and in an automated fashion through each of the separate devices on the wafer. Rejected devices can be automatically identified and tagged so they can be sorted out.

Figure 5:
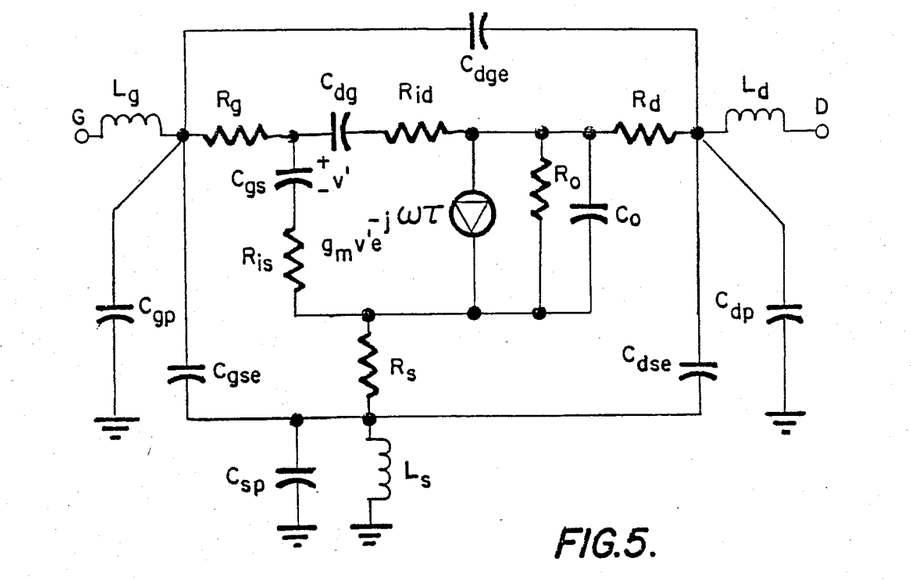
FIG. 5 is an equivalent circuit of an FET which includes the FET parameters employed by the invention to determine the noise parameters.

A conventional small-signal model of a MESFET, having frequency-independent elements and incorporating pad and bond wire parasitics, is shown in FIG. 5. It is an accurate representation of the device over a very wide frequency range, essentially DC to 40 GHz. Of the parameters incorporated in the model $C_{gs}$, $R_o$ and $g_m$ are defined above. $R_T$, the total input resistance mentioned above, is defined as the sum of the gate resistance ($R_g$), the source resistance ($R_s$) and the channel resistance between the gate and source ($R_{is}$). The other parameters used in the model are:

$L_g$ = inductance of bond wire connecting gate pad to the circuit;

$C_{gp}$ = capacitance between gate pad and back side of the wafer;

$C_{gse}$ = capacitance between gate and source pads;

$C_{dg}$ = capacitance between drain and gate;

$R_{id}$ = channel resistance between gate and drain;

$C_{sp}$ = capacitance between source pad and back side of the wafer;

$L_s$ = inductance of bond wire connecting source pad to the circuit;

$C_{dge}$ = capacitance between drain and gate pads;

$C_o$ = capacitance between drain and source;

$C_{dse}$ = capacitance between drain and source pads;

$L_d$ = inductance of bond wire connecting drain pad to the circuit;

$C_{dp}$ = capacitance between drain pad and back side of the wafer.

A MESFET was characterized over a frequency range of 45 MHz to 18 GHz by S-parameter measurements, and then a computer program was used to determine the values of the equivalent circuit parameters of FIG. 5 for a least-mean-square-error fit to the measured S-parameters. The procedure was repeated at each DC bias condition of interest to find the bias dependence of each element. The four device model parameters $C_{gs}$, $R_T$, $R_o$ and $g_m$ were found to agree with the results of low frequency and bridge measurements. These were the only FET parameters that were determined to have any significant effect upon the noise parameters under typical operating conditions.

A somewhat more detailed representation of the measurement system for $P_n$ is shown in FIG. 6. In this figure the FET is modeled as a noiseless device 26 as in FIG. 3, with input gate and output drain noise current sources $i_{gn}$ and $i_{dn}$ added to produce a noisy overall device 28. The $P_n$ receiver 24 consists of a low noise amplifier 30 which is connected (through the probe) to the FET's drain and source bonding pads and has a gain A, a narrow band filter 32 having a bandwidth B and a center frequency $f_L$ at the output of amplifier 30, a quadratic detector 34 which receives the band pass signal from filter 32, a low pass filter and averaging circuit 36 which obtains the steady state $P_n$ value, and a meter 38 to display $P_n$. The receiver's overall input resistance is designated $R_{in}$.

$P_n$ is measured at a frequency $f_L$ which is considerably lower than the operating frequency $f_o$ ($=\omega_o/2\pi$, where $\omega_o$ is the radian frequency) for which the noise parameters are desired. This is an important factor in avoiding the probe parasitic effect encountered in prior noise measurement techniques. The input (i.e., the gate-source) port is short-circuited, rather than being connected to a known or measured source admittance $Y_g$. The $P_n$ measurement frequency $f_L$ should be sufficiently high that the effects of low frequency noise sources, such as 1/f and generation-recombination noise, are negligible, thus assuring that the noise power spectral density $S_{io}$ is substantially flat between $f_L$ and $f_o$. At the same time, $f_L$ should be low enough that it is within the frequency range of available low noise amplifiers. These considerations lead to a selection of $f_L$ somewhere in the range of tens of MHz to a few GHz. It has been found that the power spectral density is substantially constant from about 30 MHz to about 1.2 GHz, and the exact frequency of measurement within this range is immaterial. This range is substantially below the upper microwave range, above about 15-20 GHz, at which probe parasitics become a limiting factor. The invention can be used to calculate the noise parameters for operating frequencies in the VHF (very high frequency: 30–300 MHz) UHF (ultra high frequency: 0.3–3 GHz) and microwave ranges. In each case the frequency used to measure $P_n$ can be lower than the intended operating frequency.

The particular bandwidth B of the receiver is also not very critical, since as shown below the effect of the receiver bandwidth is removed from the noise parameter determination. Bandwidths of 10 Hz-10 MHz are typical, depending upon the receiver employed.

An important factor in the noise parameter determination of the present invention is the employment of a power spectral density $S_{io}$ of the FET's output noise current which is independent of the receiver used to measure $P_n$. For this purpose, $S_{io}$ is calculated as a function of $P_n$ and $R_o$ by the following equation:

$$S_{io} = \frac{P_n (R_o + R_{in})^2}{AB R_o^2 R_{in}} \quad (2)$$

Since the measured $P_n$ is influenced by the receiver gain A, bandwidth B and input resistance $R_{in}$, the above equation has been found to effectively remove these three factors and provide a determination of the noise power spectral density of the output noise current which reflects the FET's true intrinsic noise.

For many commercially available low-noise preamplifiers, the input impedance $R_{in}$ is nominally about 50 ohms. By contrast, $R_o$ for 75 micron gate-widths is usually about an order of magnitude larger than such preamplifier input impedances under typical DC bias conditions. Thus, the $(R_o + R_{in})^2$ term will approach $R_o^2$. For such devices the $R_o^2$ term in both the numerator and denominator will cancel so that $R_o$ may be ignored in calculating $S_{io}$, and the measurement of $R_o$ can be entirely omitted. In this event the calculation of $S_{io}$ reduces to:

$$S_{io} = \frac{P_n}{A B R_{in}} \quad (3)$$

Expressions are described hereinafter from which the noise parameters discussed above can be derived from the equivalent circuit FET parameters and $P_n$. The coefficient $R_n$, described above, may be obtained from the following expression:

$$R_n = \frac{S_{io}/4kT}{g_m^2/(1 + \omega_o^2 C_{gs}^2 R_T^2)} \quad (4)$$

where k is Boltzman's constant, $\omega_o$ is the high microwave operating frequency for which the noise parameter is to be calculated, and T is temperature.

$F_{min}$, which is generally considered to be the most important noise parameter, can be derived from $P_n$ and the FET parameters from the following equation:

$$F_{min} = 1 + 2R_n(G_c + G_{in}) + 2[R_n(G_c + G_{in}) + R_n^2(G_c + G_{in} + G_{cor})^2]^{\frac{1}{2}}. \quad (5)$$

In the above expression $G_{in}$ is the input conductance of the FET, and is defined as follows:

$$G_{in} = \frac{\omega_o^2 C_{gs}^2 R_T}{1 + \omega_o^2 C_{gs}^2 R_T^2} \quad (6)$$

$G_c$ is the conductance of the circuit to which the FET is connected at its input (circuit 10 in FIG. 3). A reasonable approximation of $G_c$ can be derived from the insertion loss $L_{ins}$, which is readily obtainable by conventional means. If the insertion loss of the front half of the amplifier circuit 10 (i.e., the part of the circuit between the generator and the gate port) is measured in a matched system of characteristic impedance $R_{ref}$ and is found to be small, it can be expressed approximately as $$L_{ins} = 1 + R_{ref} G_c. \quad (7)$$

Thus, a measurement of insertion loss yields $G_c$. The measured insertion loss, although dependent on the circuit construction and connectors used, has been found to be approximately independent of frequency at lower frequencies (below 10 GHz), permitting $G_c$ to be treated as a frequency independent parameter in this region. At higher frequencies $G_c$ becomes much less than $G_{in}$, and can be effectively ignored because of its very small effect upon $F_{min}$.

The input conductance $G_{in}$ in the ($G_c + G_{in}$) term is an approximation which assumes that the FET being measured has a relatively low gate leakage current, which is typical of good, low-noise MESFETs. For a device with poorer gate leakage current, $G_{in}$ in the ($G_c + G_{in}$) term can be modified to incorporate the effect of noise correlation between the input and output portions of the device.

The only other term in the expression for $F_{min}$ remains to be defined is $G_{cor}$. This is the real part of the correlation admittance $Y_{cor} = G_{cor} + jB_{cor}$, which is defined as the transfer function relating the FET's equivalent noise voltage to that part of the equivalent input noise current which is fully correlated with the output noise current, and is a standard FET characterization. If the operating frequency of interest $f_0$ is significantly below the cutoff frequency of the device, the correlation coefficient becomes purely imaginary and $G_{cor}$ falls to zero. In this case $F_{min}$ is not influenced by the correlation between the input and output currents, and can be expressed through the following simplified equation:

$$F_{min} = 1 + 2R_n(G_c + G_{in}) + \quad (8)$$
$$2[R_n(G_c + G_{in}) + R_n^2(G_c + G_{in})^2]^{\frac{1}{2}}.$$

As stated previously, $G_c$ can be effectively ignored compared to $G_{in}$ at higher frequencies. In this case the $F_{min}$ expression further simplifies to:

$$F_{min} = 1 + 2R_n G_{in} + 2[R_n G_{in} + R_n^2 G_{in}^2]^{\frac{1}{2}}. \quad (9)$$

Figure 7:
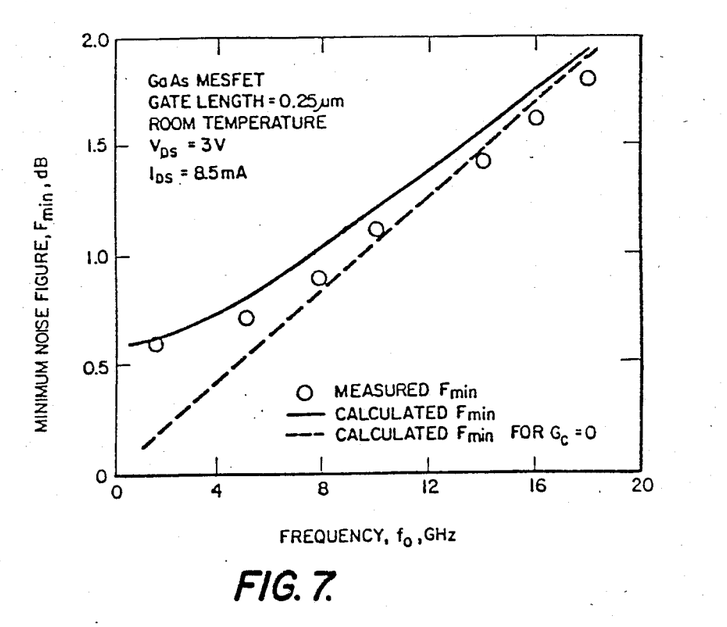
FIG. 7 is a graph comparing measured values of $F_{min}$ with calculated values obtained with the invention.

The above expression was obtained empirically with a MESFET noise model in A. F. Podell, "A Functional GaAs FET Noise Model," *IEEE Trans. Electron Devices*, Vol. Ed-28, No. 5, pages 511–517, May 1981. This matching with the empirical determination of Podell provides further substantiation of the S-parameter measurement approach used in the present invention. A plot of measured $F_{min}$ and $F_{min}$ as calculated by the invention, with and without $G_c$, is provided in FIG. 7.

The remaining two noise parameters $G_{g,op}$ and $B_{g,op}$, which are the optimum values respectively of $G_g$ and $B_g$, are similarly derived from at least some of the equivalent circuit FET parameters, although only $G_{g,op}$ is dependent upon $P_n$. The expression for $G_{g,op}$ has been found to be:

$$G_{g,op} = \left[(G_c + G_{cor} + G_{in})^2 + \frac{G_c + G_{in}}{R_n}\right]^{\frac{1}{2}}. \quad (10)$$

For the small gate leakage assumption at which the correlation coefficient between the input and output noise currents becomes purely imaginary, the expression reduces to:

$$G_{g,op} = \left[(G_c + G_{in})^2 + \frac{G_c + G_{in}}{R_n}\right]^{\frac{1}{2}}. \quad (11)$$

The expression for the optimum value of $B_g$ is:

$$B_{g,op} = B_c + B_{in} + B_{cor}, \quad (12)$$

in which $B_{cor}$ is the FET's correlation susceptance (a standard characterization parameter) and $B_{in}$ is defined as follows:

$$B_{in} = \frac{\omega_o C_{gs}}{1 + \omega_o^2 C_{gs}^2 R_T^2}. \quad (13)$$

Thus, of the equivalent circuit FET elements the optimum value of $B_g$ depends only upon $C_{gs}$ and $R_T$, and $P_n$ is not utilized in the $B_{g,op}$ calculation.

The noise parameter expressions given above are directly applicable to the common source configuration illustrated in FIGS. 3 and 6, which is the preferred embodiment because the intrinsic noise power $P_n$ is easiest to measure between the device's source and drain. However, if the noise parameters for a common gate or common drain configuration are desired, they can be derived from the common source noise parameters by conventional equations. The noise parameter equations also assume that the noise temperature of the external circuit conductance $G_c$ is equal to the reference temperature, typically room temperature of 290° K., and that the output noise current is white and has a constant power spectral density $S_{io}$.

A unique measurement technique which for the first time permits FET noise parameters to be obtained at the wafer stage has thus been shown and described. Numerous variations and modifications of this technique will occur to those skilled in the art. For example, although the use of S-parameters is preferred, the values of $C_{gs}$, $R_T$, $g_m$ and $R_o$ can be determined by other methods such as bridge measurement. While the invention makes it realistic to determine the noise parameters before dicing, bonding and mounting, the noise parameter determination can also be done afterwards. Also, although the greatest economics are realized with wafers consisting of many FETs, the invention is applicable to wafers with only a single FET. Accordingly, it is intended that the invention be limited only in terms of the appended claims.

We claim:
1. A method of determining a noise parameter of a field effect transistor (FET) formed on a single wafer with a plurality of other FETs, comprising:
   determining at least some of the FETs equivalent circuit parameters consisting of the input gate-to-source capacitance ($C_{gs}$), input resistance ($R_T$), transconductance ($g_m$) and output resistance ($R_o$) while the FET is in a wafer state, and
   measuring the output power ($P_n$) of the FETs intrinsic noise with a receiver, determining the power spectral density ($S_{io}$) of the FETs intrinsic noise current independent of the receiver used to measure $P_n$, and utilizing $S_{io}$ along with said FET equivalent circuit parameters in the calculation of the noise parameter.

2. The method of claim 1, wherein said FET equivalent circuit parameters are determined by measuring the FET's S-parameters and deriving said equivalent circuit parameters therefrom.

3. The method of claim 2, said FET having a gate, source and drain, wherein the S-parameter and $P_n$ measurements are made for a common source configuration of the FET.

4. The method of claim 3, to determine an FET noise parameter for an FET configuration other than common source, wherein the noise parameter for a common source configuration is first determined, and the noise parameter for said other configuration is then calculated from the common source noise parameter.

5. The method of claim 2, wherein the FET is contacted with a probe to obtain $P_n$, the probe exhibiting substantial parasitic effects within a range of higher microwave frequencies which would interfere with obtaining $P_n$, wherein $P_n$ is obtained at a substantially lower frequency.

6. The method of claim 5, wherein the noise parameter is calculated for an operating frequency within said higher microwave range.

7. A method of determining a noise parameter of a field effect transistor (FET), comprising:
- determining the input gate-to-source capacitance ($C_{gs}$), input resistance ($R_T$) and transconductance ($g_m$) parameters of the FET,
- measuring the output power of the FET's intrinsic noise ($P_n$) with a receiver,
- determining the power spectral density ($S_{io}$) of the FET's intrinsic noise current independent of the receiver used to measure $P_n$, and
- calculating the noise parameter based upon said measurements and said $S_{io}$ determination.

8. The method of claim 7, wherein said FET parameters are determined by measuring the FET's S-parameters and deriving said FET parameters therefrom.

9. The method of claim 8, for an FET formed on a single wafer with a plurality of other FETs, wherein said noise parameter determination is made for said FET while in a wafer state.

10. The method of claim 8, wherein $S_{io}$ is determined by determining the FET's output resistance ($R_o$) and calculating $S_{io}$ as a function of $R_o$ and $P_n$.

11. The method of claim 10, wherein $S_{io}$ is calculated in accordance with the equation:

$$S_{io} = \frac{P_n (R_o + R_{in})^2}{AB R_o^2 R_{in}}$$

where $R_{in}$, A and B are respectively the input resistance, gain and bandwidth of the receiver used to measure $P_n$.

12. The method of claim 8, wherein $S_{io}$ is determined by calculation as a function of $P_n$.

13. The method of claim 12, wherein $S_{io}$ is calculated in accordance with the equation:

$$S_{io} = \frac{P_n}{A B R_{in}}$$

where $R_{in}$, A and B are respectively the input resistance, gain and bandwidth of the receiver used to measure $P_n$.

14. The method of claim 8, wherein $P_n$ is measured at a VHF, UHF or microwave frequency, and the noise parameter is calculated for an operating frequency greater than the frequency of measurement of $P_n$.

15. A method of determining the minimum noise figure $F_{min}$ of a field effect transistor (FET) which is connected in a circuit having a conductance $G_c$, comprising:
- determining the input gate-to-source capacitance ($C_{gs}$), input resistance ($R_T$), transconductance ($g_m$) and output resistance ($R_o$) parameters of the FET,
- measuring the output power ($P_n$) of the FET's intrinsic noise with a receiver having a gain A, a bandwidth B, and an input resistance $R_{in}$, and
- calculating $F_{min}$ for an operating radian frequency of interest $\omega_o$ in accordance with the equation:

$$F_{min} = 1 + 2R_n(G_c + G_{in}) + 2[R_n(G_c + G_{in}) + R_n^2(G_c + G_{in})^2]^{\frac{1}{2}}.$$

where $$S_{io} = \frac{P_n (R_o + R_{in})^2}{AB R_o^2 R_{in}},$$

$$R_n = \frac{S_{io}/4kT}{g_m^2/(1 + \omega_o^2 C_{gs}^2 R_T^2)},$$

$$G_{in} = \frac{\omega_o^2 C_{gs}^2 R_T}{1 + \omega_o^2 C_{gs}^2 R_T^2},$$

k = Boltzman's constant, and

T = temperature.

16. The method of claim 15, wherein said FET parameters are determined by measuring the FET's S-parameters and deriving said FET parameters therefrom.

17. The method of claim 16, for an FET formed on a single wafer with a plurality of other FETs, wherein $F_{min}$ is determined for said FET while in a wafer state.

18. The method of claim 15, wherein $P_n$ is measured at a VHF, UHF or microwave frequency, and $F_{min}$ is calculated for an operating frequency greater than the frequency of measurement of $P_n$.

19. A method of determining the minimum noise figure $F_{min}$ of a field effect transistor (FET) which is connected in a circuit having a conductance $G_c$, comprising:
- determining the input gate-to-source capacitance ($C_{gs}$), input resistance ($R_T$) and transconductance ($g_m$) parameters of the FET,
- measuring the output power ($P_n$) of the FET's intrinsic noise with a receiver having a gain A, a bandwidth B, and an input resistance $R_{in}$, and
- calculating $F_{min}$ for an operating radian frequency of interest $\omega_o$ in accordance with the equation:

$$F_{min} = 1 + 2R_n(G_c + G_{in}) + 2[R_n(G_c + G_{in}) + R_n^2(G_c + G_{in})^2]^{\frac{1}{2}},$$

where $$S_{io} = \frac{P_n}{A B R_{in}},$$

$$R_n = \frac{S_{io}/4kT}{g_m^2/(1 + \omega_o^2 C_{gs}^2 R_T^2)},$$

$$G_{in} = \frac{\omega_o^2 C_{gs}^2 R_T}{1 + \omega_o^2 C_{gs}^2 R_T^2}, \text{ and}$$

k = Boltzman's constant, and
T = temperature.

20. The method of claim 19, wherein said FET parameters are determined by measuring the FET's S-parameters and deriving said FET parameters therefrom.

21. The method of claim 20, for an FET formed on a single wafer with a plurality of other FETs, wherein $F_{min}$ is determined for said FET while in a wafer state.

22. The method of claim 19, wherein $P_n$ is measured at a VHF, UHF or microwave frequency, and $F_{min}$ is calculated for an operating frequency greater than the frequency of measurement of $P_n$.

23. A method of determining the minimum noise figure $F_{min}$ of a field effect transistor (FET) which is connected in an embedding circuit having a conductance $G_c$, comprising:

determining the input gate-to-source capacitance ($C_{gs}$), input resistance ($R_T$) and transconductance ($g_m$) parameters of the FET, measuring the output power ($P_n$) of the FET's intrinsic noise with a receiver having a gain A, a bandwidth B, and an input resistance $R_{in}$ and calculating $F_{min}$ for an operating radian frequency of interest $\omega_o$ in accordance with the equation:

$$F_{min} = 1 + 2R_n(G_c + G_{in} + G_{cor}) + 2[R_n(G_c + G_{in}) + R_n^2(G_c + G_{in} + G_{cor})^2]^{\frac{1}{2}},$$

where $$S_{io} = \frac{P_n}{A B R_{in}},$$

$$R_n = \frac{S_{io}/4kT}{g_m^2/(1 + \omega_o^2 C_{gs}^2 R_T^2)},$$

$$G_{in} = \frac{\omega_o^2 C_{gs}^2 R_T}{1 + \omega_o^2 C_{gs}^2 R_T^2},$$

k = Boltzman's constant, and
T = temperature.

24. The method of claim 23, wherein said FET parameters are determined by measuring the FET's S-parameters and deriving said FET parameters therefrom.

25. The method of claim 24, for an FET formed on a single wafer with a plurality of other FETs, wherein $F_{min}$ is determined for said FET while in a wafer state.

26. The method of claim 23, wherein $P_n$ is measured at a VHF, UHF or microwave frequency, and $F_{min}$ is calculated for an operating frequency greater than the frequency of measurement of $P_n$.

27. The method of claim 23, wherein the FET's output resistance ($R_o$) is also determined, and $R_o$ is included in the calculation of $S_{io}$ in accordance with the following equation:

$$S_{io} = \frac{P_n (R_o + R_{in})^2}{AB R_o^2 R_{in}}.$$

* * * * *